United States Patent
Bhat et al.

(10) Patent No.: US 10,495,709 B2
(45) Date of Patent: Dec. 3, 2019

(54) MULTI-CONTRAST SIMULTANEOUS MULTISLICE MAGNETIC RESONANCE IMAGING WITH BINOMIAL RADIO-FREQUENCY PULSES

(71) Applicant: SIEMENS HEALTHCARE GMBH, Erlangen (DE)

(72) Inventors: Himanshu Bhat, Newton, MA (US); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 418 days.

(21) Appl. No.: 15/218,388

(22) Filed: Jul. 25, 2016

(65) Prior Publication Data

US 2018/0024214 A1    Jan. 25, 2018

(51) Int. Cl.
  *G01R 33/48* (2006.01)
  *G01R 33/561* (2006.01)
  *G01R 33/483* (2006.01)

(52) U.S. Cl.
  CPC ..... *G01R 33/4828* (2013.01); *G01R 33/4835* (2013.01); *G01R 33/5611* (2013.01); *G01R 33/5617* (2013.01)

(58) Field of Classification Search
  CPC ........... G01R 33/5608; G01R 33/5611; G01R 33/4835; G01R 33/4828; G01R 33/543
  USPC ........................................................ 324/309
  See application file for complete search history.

(56) References Cited

U.S. PATENT DOCUMENTS

| | | | | |
|---|---|---|---|---|
| 5,000,182 A | * | 3/1991 | Hinks | A61B 5/0456 600/413 |
| 5,270,653 A | * | 12/1993 | Pauly | G01R 33/446 324/309 |
| 8,248,070 B1 | * | 8/2012 | Wheaton | G01R 33/4828 324/307 |
| 2003/0100744 A1 | * | 5/2003 | Farinas | C12N 9/0071 536/23.2 |
| 2013/0099784 A1 | * | 4/2013 | Setsompop | G01R 33/54 324/309 |
| 2014/0253120 A1 | * | 9/2014 | Ugurbil | A61B 5/055 324/309 |
| 2015/0115958 A1 | * | 4/2015 | Wang | G01R 33/4835 324/309 |
| 2015/0260820 A1 | | 9/2015 | Speier | |
| 2015/0323634 A1 | * | 11/2015 | Polimeni | G01R 33/56509 324/309 |
| 2015/0346300 A1 | * | 12/2015 | Setsompop | G01R 33/4828 324/309 |

(Continued)

OTHER PUBLICATIONS

Barth, Markus, et al. "Simultaneous multislice (SMS) imaging techniques." Magnetic resonance in medicine 75.1 (2016): 63-81. (Year: 2016).*

(Continued)

*Primary Examiner* — Christopher P McAndrew
(74) *Attorney, Agent, or Firm* — Schiff Hardin LLP

(57) ABSTRACT

In a magnetic resonance apparatus and a method for operating the MR apparatus to acquire MR data in a single scan with different contrasts, nuclear spins in multiple slices of an examination subject are simultaneously excited in a single scan, with a simultaneous multi-slice acquisition sequence, in which a radio-frequency multi-band binomial pulse is radiated.

24 Claims, 8 Drawing Sheets

(56) References Cited

U.S. PATENT DOCUMENTS

2015/0362574 A1* 12/2015 Wu .................... G01R 33/4835
324/322

OTHER PUBLICATIONS

Barth, Markus, et al. "Simultaneous multislice (SMS) imaging techniques." Magnetic resonance in medicine 75.1 (2016): 63-81 (Year: 2016).*
Barth, M., Breuer, F., Koopmans, P.J., Norris, D.G. and Poser, B.A., 2016. Simultaneous multislice (SMS) imaging techniques. Magnetic resonance in medicine, 75(1), pp. 63-81. (Year: 2016).*
Setsopmpop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).
Setsompop et al., "Improving Diffusion MRI Using Simultaneous Multi-Slice Echo Planar Imaging," NeuroImage, vol. 63, pp. 569-580 (2012).
Cauley et al., "Interslice Leakage Artifact Reduction Technique for Simultaneous Multislice Acquisitions," Magnetic Resonance in Medicine, vol. 72, pp. 93-102 (2014).
Hauger et al., "Water Excitation as an Alternative to Fat Saturation in MR Imaging: Preliminary Results in Musculoskeletal Imaging," Radiology, vol. 224, pp. 657-663 (2002).
Lin et al., "Rapid Phase-Modulated Water-Excitation Steady-State Free Precession for Fat-Suppressed Cine Cardiovascular MR," Journal of Cardiovascular Magnetic Resonance, vol. 10, No. 22 (2008), doi:10.1186/1532-429 X-10.
Provisional Application, Filed Oct. 15, 2015, U.S. Appl. No. 62/241,849.
Wang. et al.: "Multiband Slice Accelerated TSE for High Resolution Knee Imaging"; Proceedings Of The International Society For Magnetic Resonance In Medicine, Joint Annual Meeting ISMRM-ESMRMB; No. 1216; p. 1216, (2014).
Lee et al: "Multiplex RARE: A Simultaneous Multislice Spin-Echo Sequence That Fulfils CPMG Conditions"; Magnetic Resonance in Medicine, vol. 64, No. 1, pp. 299-305, (2010).
Hauger et al.: "Water Excitation as an Alternative to Fat Saturation In MR Imaging: Preliminary Results in Musculoskeletal Imaging1"; Radiology; vol. 224, No. 3; pp. 657-663; (2002).
Crijns et al., "Simultaneous multi-slice imaging with chemical shift separation"; Proceedings Of The International Society. For Magnetic Resonance In Medicine, 23rd Annual Meeting & Exhibition, p. 0243, (2015).
Wang et al., "Improving Time Efficiency for T2-weighted Fat-Water Imaging by Using Multiband Simultaneous Multi-Slice Accelerated TSE Dixon," Proc. Int. Soc. for Magnetic Resonance in Medicine, 24th Annual Meeting & Exhibition, Singapore (2016).

* cited by examiner

MULTI-CONTRAST SIMULTANEOUS MULTISLICE MAGNETIC RESONANCE IMAGING WITH BINOMIAL RADIO-FREQUENCY PULSES

BACKGROUND OF THE INVENTION

The present invention concerns magnetic resonance (MR) imaging, and in particular concerns simultaneous multi-slice (SMS) MR imaging.

DESCRIPTION OF THE PRIOR ART

MR imaging is a widely used imaging modality for medical diagnosis as well as for material inspection.

In a magnetic resonance apparatus, the examination object (a patient, in the case of medical magnetic resonance imaging) is exposed to a strong and constant basic magnetic field, by the operation of a basic field magnet of an MR scanner, in which the examination object is situated. The MR scanner also has a gradient coil arrangement that is operated in order to activate gradient fields that spatially encode the magnetic resonance signals. The magnetic resonance signals are produced by the radiation of radio-frequency (RF) pulses from an RF radiator, such as one or more antennas, in the MR scanner. These RF pulses excite nuclear spins in the examination object, and are therefore often called excitation pulses. The excitation of the nuclear spins at an appropriate frequency gives the excited spins a magnetization that causes the nuclear spins to deviate, by an amount called the flip angle, from the alignment of the nuclear spins that was produced by the basic magnetic field. As the nuclear spins relax, while returning to alignment in the basic magnetic field, they emit MR signals (which are also RF signals), which are received by suitable RF reception antennas in the MR scanner, which may be the same or different from the RF radiator used to emit the excitation pulse.

The emitted MR signals have a signal intensity that is dependent on the exponential decay over time of the magnetization of the nuclear spins. The acquired signals are digitized so as to form raw data, which are entered into a memory that is organized as k-space, as k-space data. Many techniques are known for reconstructing an image of the examination object from the k-space data.

By appropriately selecting different characteristics of the MR data acquisition sequence that is used, the acquired signals can be differently weighted so that different sources of the detected MR signals (i.e., different tissues in the case of medical MR imaging) appear with different contrasts in the reconstructed image. In the case of medical MR imaging, a weighting is selected that causes the tissue that is important for making the intended medical diagnosis to have the best contrast (brightness) in the reconstructed image. One such type of weighting is known as T1-weighting, because it depends on the so-called T1 relaxation time of the nuclear spins.

Many different techniques are known for acquiring the raw MR data. One such technique is known as simultaneous multi-slice (SMS) acquisition, which is a technique for accelerating the acquisition of the data from a given volume of the examination object, wherein nuclear spins in multiple slices are excited simultaneously, and the resulting MR signals are simultaneously acquired from each slice. This results in a dataset in k-space that is composed of data from the multiple slices collapsed on top of each other. Techniques are known for separating or uncollapsing the data for these respective slices during image reconstruction, such as the slice GRAPPA (Generalized Autocalibration Partially Parallel Acquisitions) technique, which is schematically illustrated in FIG. 1. In the example shown in FIG. 1, multiple slices S1, S2 and S3 are excited simultaneously, resulting in each slice generating an echo train of magnetic resonance signals, which are acquired according to the known blipped CAIPIRINHA (Controlled Aliasing in Parallel Imaging Results in Higher Acceleration) technique. Details of such techniques are described, for example, in Setsompop et al., "Blipped-Controlled Aliasing in Parallel Imaging for Simultaneous Multislice Echo Planar Imaging With Reduced g-Factor Penalty," Magnetic Resonance in Medicine, Vol. 67, pp. 1210-1224 (2012) and Setsompop et al., "Improving Diffusion MRI Using Simultaneous Multi-Slice Echo Planar Imaging," NeuroImage, Vol. 63, pp. 569-580 (2012) and Cauley et al., "Interslice Leakage Artifact Reduction Technique for Simultaneous Multislice Acquisitions," Magnetic Resonance in Medicine, Vol. 72, pp. 93-102 (2014).

Excitation of the nuclear spins in the simultaneously acquired slices is implemented with a multi-band (MB) RF pulse. An MB RF pulse is generated by the superimposition of a number of individual single band (SB) RF pulses, of the type that are typically used to excite nuclear spins in a single selected slice in conventional magnetic resonance imaging.

The turbo spin echo (TSE) sequence is the "clinical workhorse" sequence for MR imaging, by virtue of being the most utilized sequence for all types of body region imaging. A TSE sequence has several echo trains, and in each echo train, multiple phase encoding lines of the entirety of k-space are scanned (filled with data) after one excitation pulse. This is achieved by refocusing the spins after each readout line, utilizing refocusing RF pulses. Compared to a conventional spin echo (SE) sequence, the acquisition time in a TSE sequence is reduced by the number of refocused echoes in one echo train. This reduction is known as the turbo factor.

It is known to combine SMS and TSE, in order to acquire data from two or more slices simultaneously. This reduces the minimum repetition time (TR) which is given by the length of all echo trains for all slices that are executed back-to-back. The reduction occurs because fewer slices must be acquired with such a combination. The total number of reduced slices is known as the slice acceleration factor. For many examinations, however, the minimum TR is not limited by the total time of all echo trains, but instead is limited by the desired image contrast.

For example, for T2-weighted imaging, a long TR is necessary to allow for T1 relaxation to provide the desired T2 contrast. This means that if the TR is five seconds without SMS, an SMS factor of 2 would allow a TR reduction to 2.5 seconds, but this reduction cannot be achieved without changing the image contrast to a level that is not clinically acceptable.

In order to provide adequate diagnostics, it is often necessary to acquire the identical slice stack of a subject with two different TSE contrasts. One example is a T2-weighted TSE and a T2-weighted TSE with CSF attenuation for the brain (known as a FLAIR sequence). Another example is a T1, proton density (PD) or T2-weighted TSE with and without fat saturation (fs) for joint imaging, known as T1/T1 fs, PD/PD fs or T2/T2 fs.

In these types of known sequence combinations, each sequence (T1 and T1 fs TSE) must be executed separately by the data acquisition scanner. Because of the aforementioned limitations, no considerable acceleration in the data acquisition can be achieved with SMS in such a combination.

SUMMARY OF THE INVENTION

An object of the present invention is to provide an SMS MR imaging sequence, and an MR imaging apparatus operating according to such a sequence, wherein MR data with two contrasts can be obtained in a single scan.

This object is achieved in accordance with the present invention in an SMS sequence in which the nuclear spins are excited by a binomial RF pulse composed of different sub-pulses respectively for two slices, with nuclear spins being excited simultaneously in the two slices. The different sub-pulses of the binomial RF pulse respectively produce different contrasts in the two slices (i.e., a first contrast in one of the slices and a second, different contrast in the other of the slices). In order to obtain images with both contrasts for both slices, the excitation is then repeated with the respective sub-pulses interchanged for the two slices, so images can then be reconstructed for each slice with each contrast.

In an embodiment of the method and apparatus according to the invention, a first sub-pulse sequence of the binomial pulse leads to a saturation of fat, and a second sub-pulse sequence of the binomial pulse leads to excitation of fat and water. This embodiment is particularly useful in combination with TSE imaging of joints, for which typically the same contrast is needed both with and without fat saturation. The clinical value of fat saturation by water excitation has been demonstrated for single-band TSE imaging (Hauger et al., "Water Excitation as an Alternative to Fat Saturation in MR Imaging: Preliminary Results in Musculoskeletal Imaging," Radiology, Vol. 224, pp. 657-663 (2002)). Other body regions and sequence types, however, are feasible as well such as simultaneous SE/fs-SE imaging in the brain at 1.5 T, or all versions of the gradient echo sequence.

The basis of the method and apparatus in accordance with the present invention is the simultaneous excitation and acquisition of two slices. That principle can be extended to more than two simultaneously acquired slices, as described in Provisional Application 62/241,849, filed Oct. 15, 2015, the content of which is incorporated herein by reference.

The method and apparatus in accordance with the invention allow the simultaneous acquisition of two contrasts in one scan. The total acquisition time is halved compared to the acquisition of both contrasts with conventional single-band imaging. Because the acquisition parameters such as TE and TR can be kept identical, the overall image contrast will not suffer.

DESCRIPTION OF THE PREFERRED EMBODIMENTS

Figure 8:
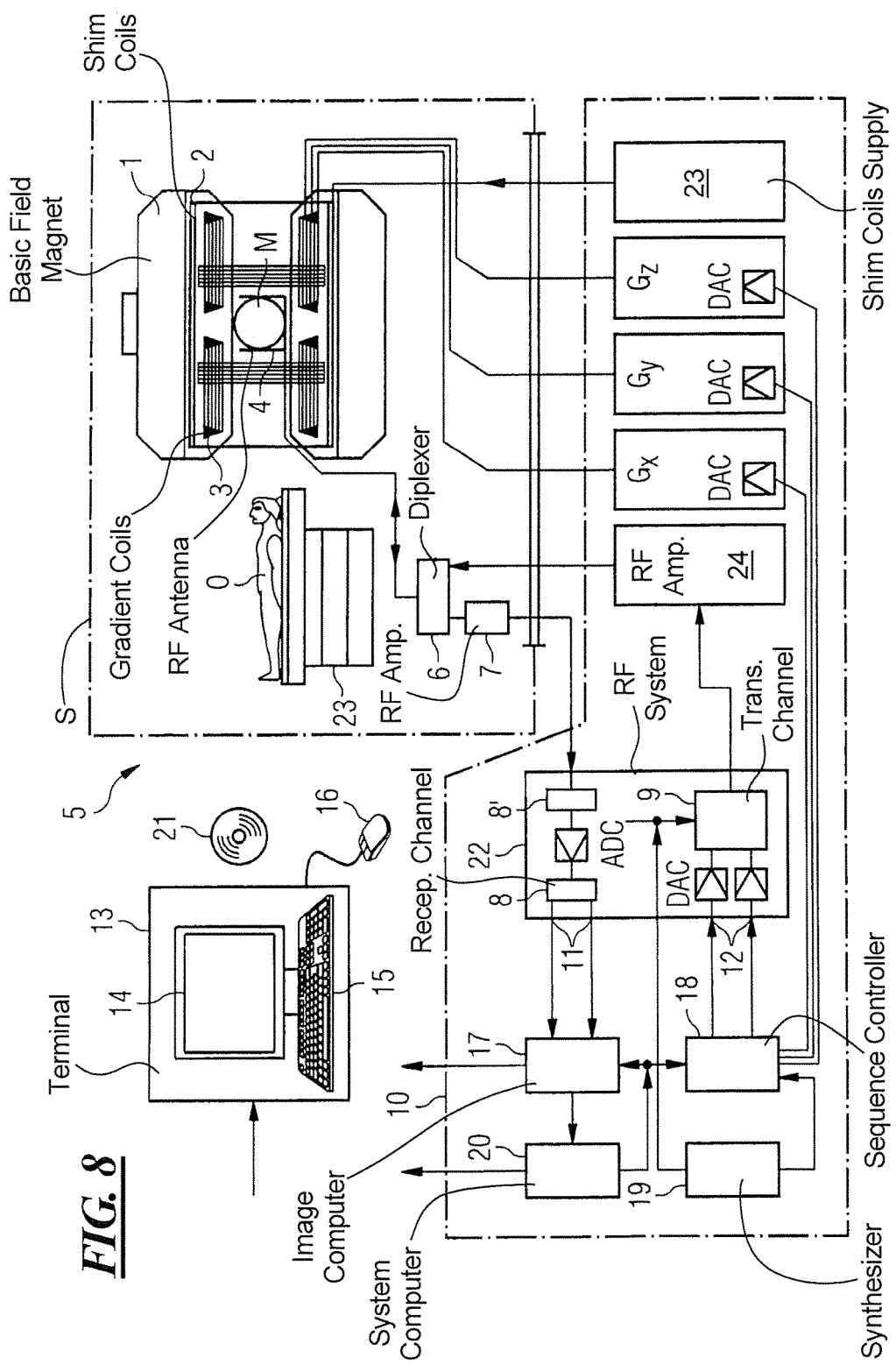
FIG. 8 schematically illustrates a magnetic resonance imaging apparatus constructed and operating in accordance with the present invention.

FIG. 8 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 23 for the shim-coils 2.

A cylindrically shaped gradient coil system 3 is incorporated in the basic field magnet 1, composed of three windings. Each winding is supplied by a corresponding amplifier $G_x$, $G_y$, and $G_z$, with power for generating a linear gradient field in a respective axis of a Cartesian coordinate system. The first partial winding of the gradient field system 3 generates a gradient $G_x$ in the x-axis, the second partial winding generates a gradient $G_y$ in the y-axis, and the third partial winding generates a gradient $G_z$ in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

Figure 1:
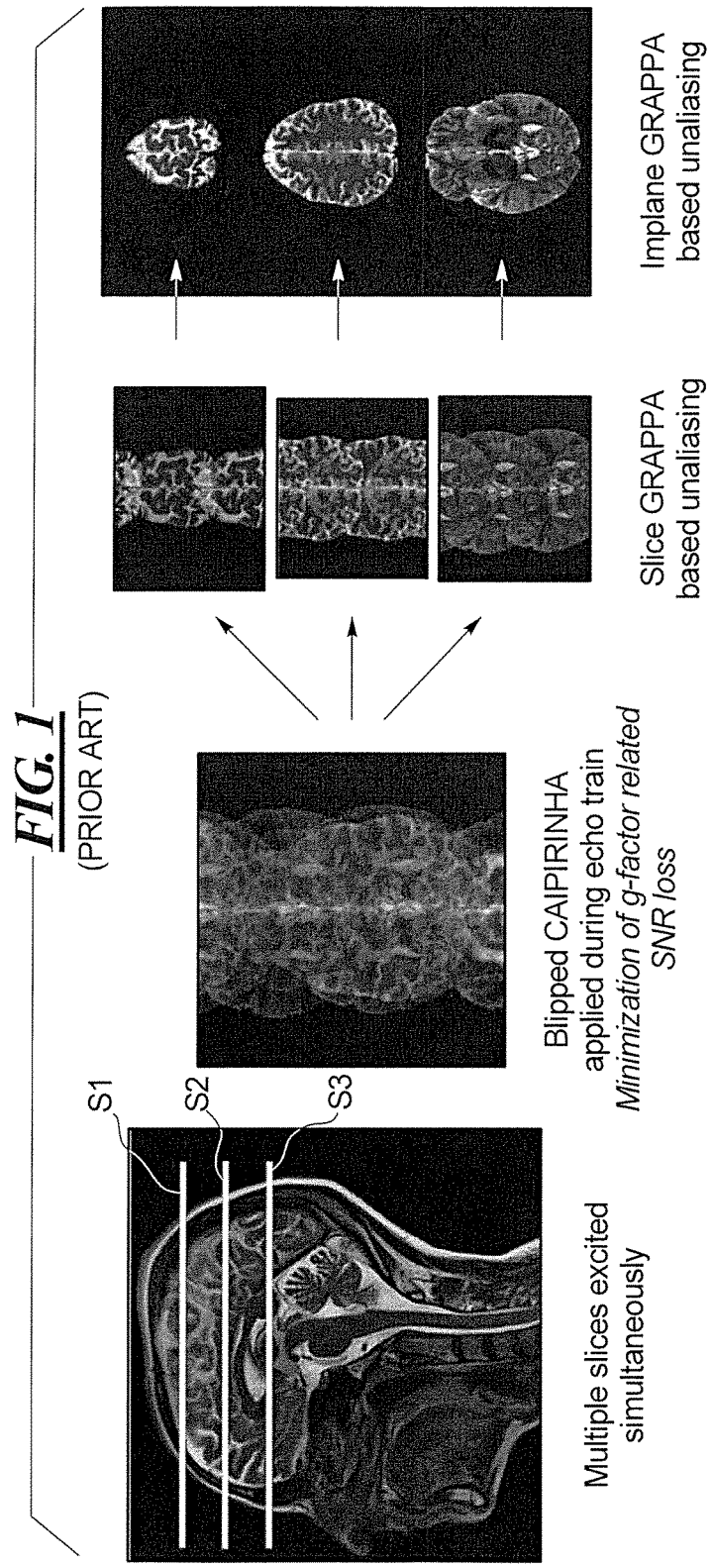
FIG. 1, as noted above, schematically illustrates a conventional SMS acceleration technique.
Figure 2:
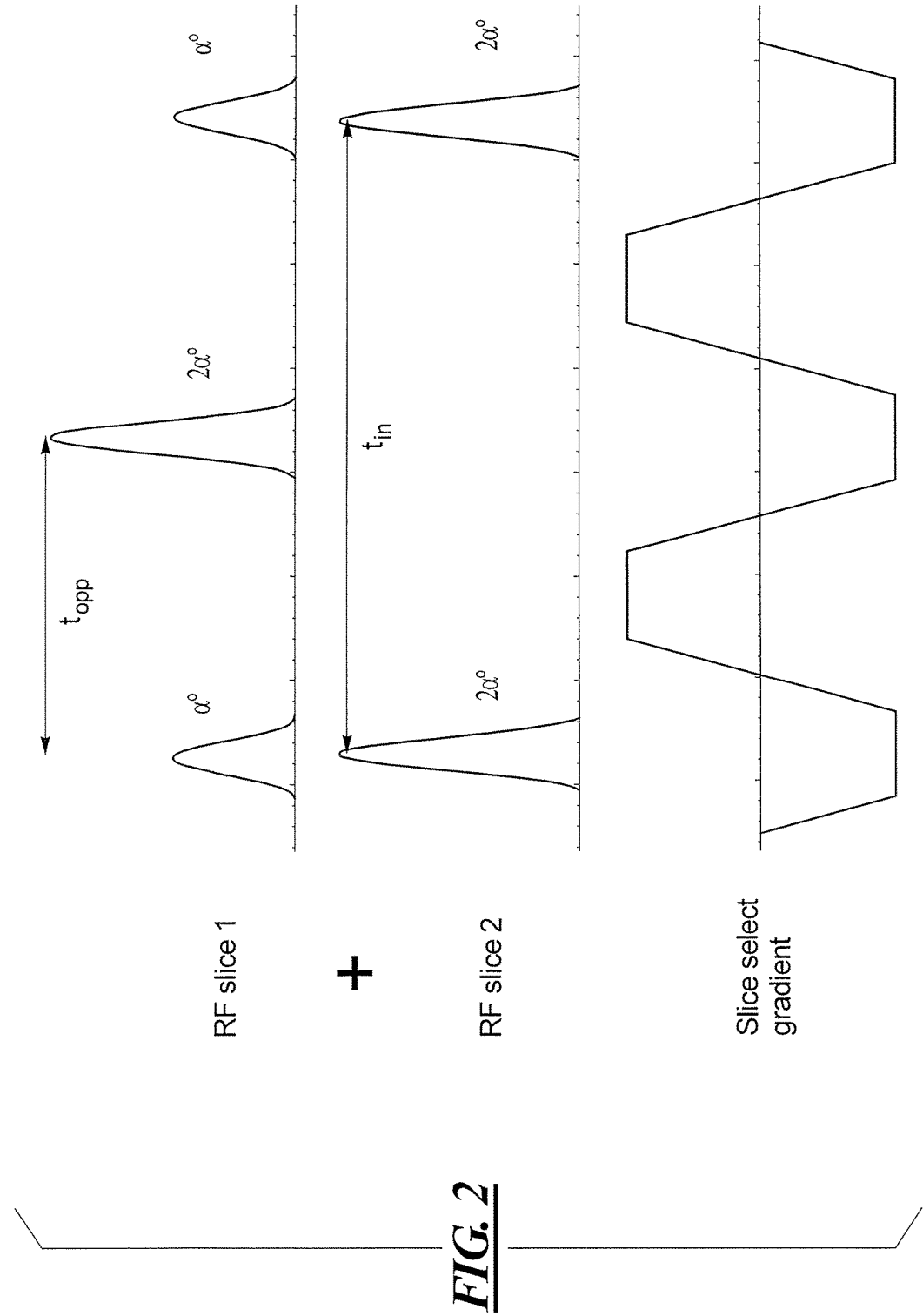
FIG. 2 shows a multi-band binomial pulse in accordance with the invention, and a slice select gradient, in a first embodiment of the method according to the invention.

An example of a multi-band binomial pulse in accordance with the invention, having different sub-pulses for slices to be excited simultaneously, is shown in FIG. 2. Slice 1 and slice 2 are simultaneously selected by a slice select gradient. The RF pulses for the two slices (slice 1 and slice 2) are emitted so as to acquire data from slice 1 and slice 2 simultaneously. The pulse scheme targeting slice 1 is standard 1-2-1 water excitation scheme, as described in the aforementioned article by Hauger et al. The pulse scheme targeting slice 1, therefore, consists of three sub-pulses. The first pulse excites fat and water and tips the magnetization by 22.5°. After a waiting period $t_{opp}$, the fat and water spins have opposed phase. The second pulse tips both vectors by another 45°. The water vector is moved further toward the transverse plane, while the fat vector is just "flipped" around its precession axis. After another waiting period, a third RF pulse is radiated. This pulse moves the water vector completely into the transverse plane, while the fat vector is again aligned along the z-axis. The binomial excitation pulse scheme is followed by a conventional readout (for example, TSE, EPI or SE). Because only water spins remain in the transverse plane, no fat signal contributes to the final image. The above explanation of the magnetization vectors for the pulse scheme that targets slice 1 is schematically shown in the top line of FIG. 3. RF1 indicates the time point after the first sub-pulse has been played out, $t_{opp}$ indicates the time point when fat and water spins are out of phase, RF2 indicates the time point after the second sub-pulse has been played out, $t_{in}$ indicates the time points when fat and water spins are in phase again which corresponds to $2 \cdot t_{opp}$ and RF3 indicates the time point after the third sub-pulse has been played out.

Figure 3:
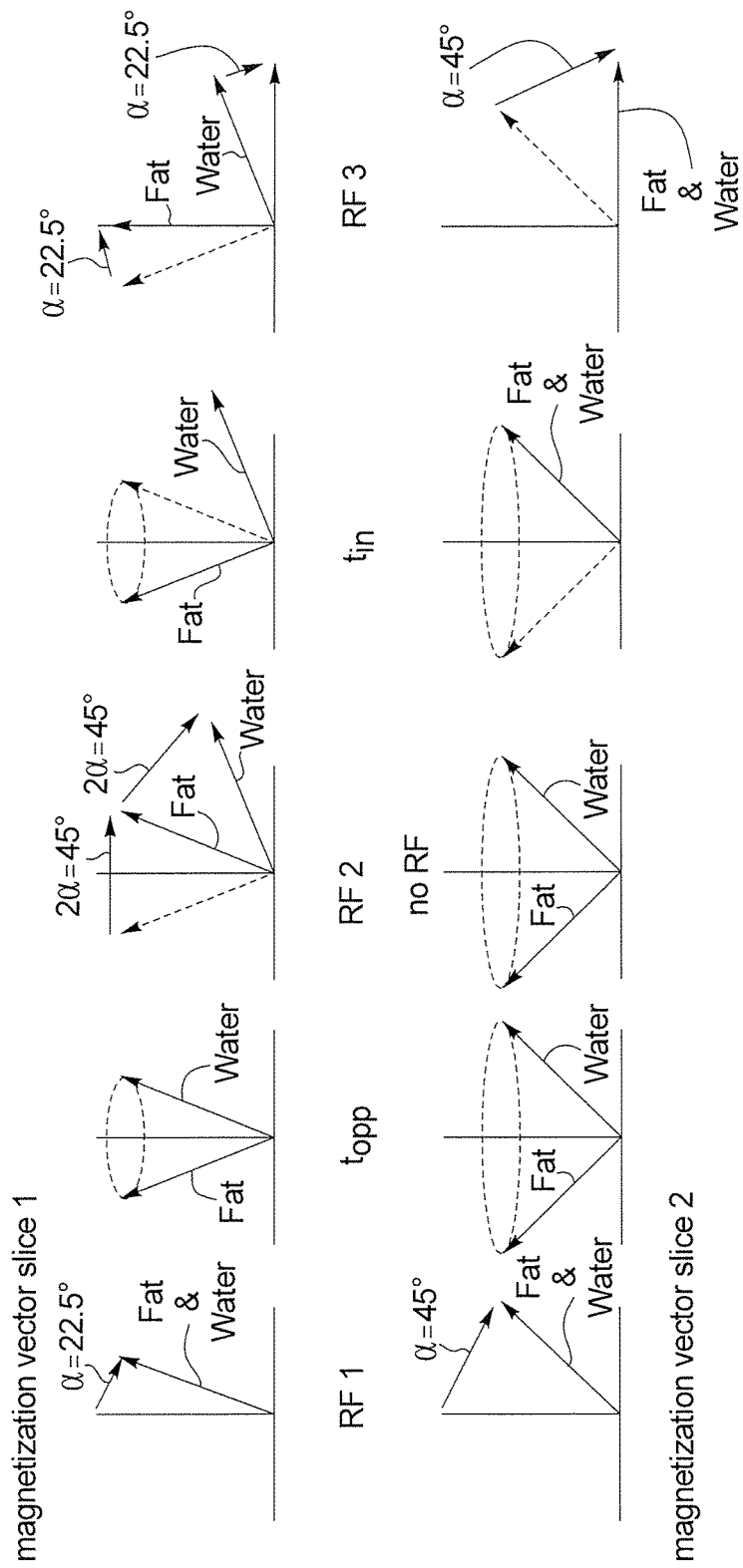
FIG. 3 schematically illustrates the magnetization vectors for fat and water that occur during the execution of the pulse sequence shown in FIG. 2.

The pulse scheme for slice 2 is shown in the middle row of FIG. 2, and the magnetization vectors are correspondingly shown in the bottom line in FIG. 3. Fat and water magnetization are on the vertical axis. In the pulse scheme for slice 2, the first pulse tips fat and water spins by 45°. There is no second pulse in the pulse scheme for slice 2. The "third" pulse in the slice scheme for slice 2 is another 45° pulse. Because both vectors are in phase again at that time, as can be seen in FIG. 3, both magnetization vectors are in the transverse plane after that pulse. The image acquired by the subsequent readout thus contains fat and water signals. The designation $t_{in}$ indicates when fat and water are in phase. RF2 is radiated at $t_{opp}$ and RF3 is radiated at $t_{in}$.

Both binomial pulse schemes can be phase-modulated and summed to form a multi-band pulse, which targets both slices with different contrasts simultaneously.

Figure 4:
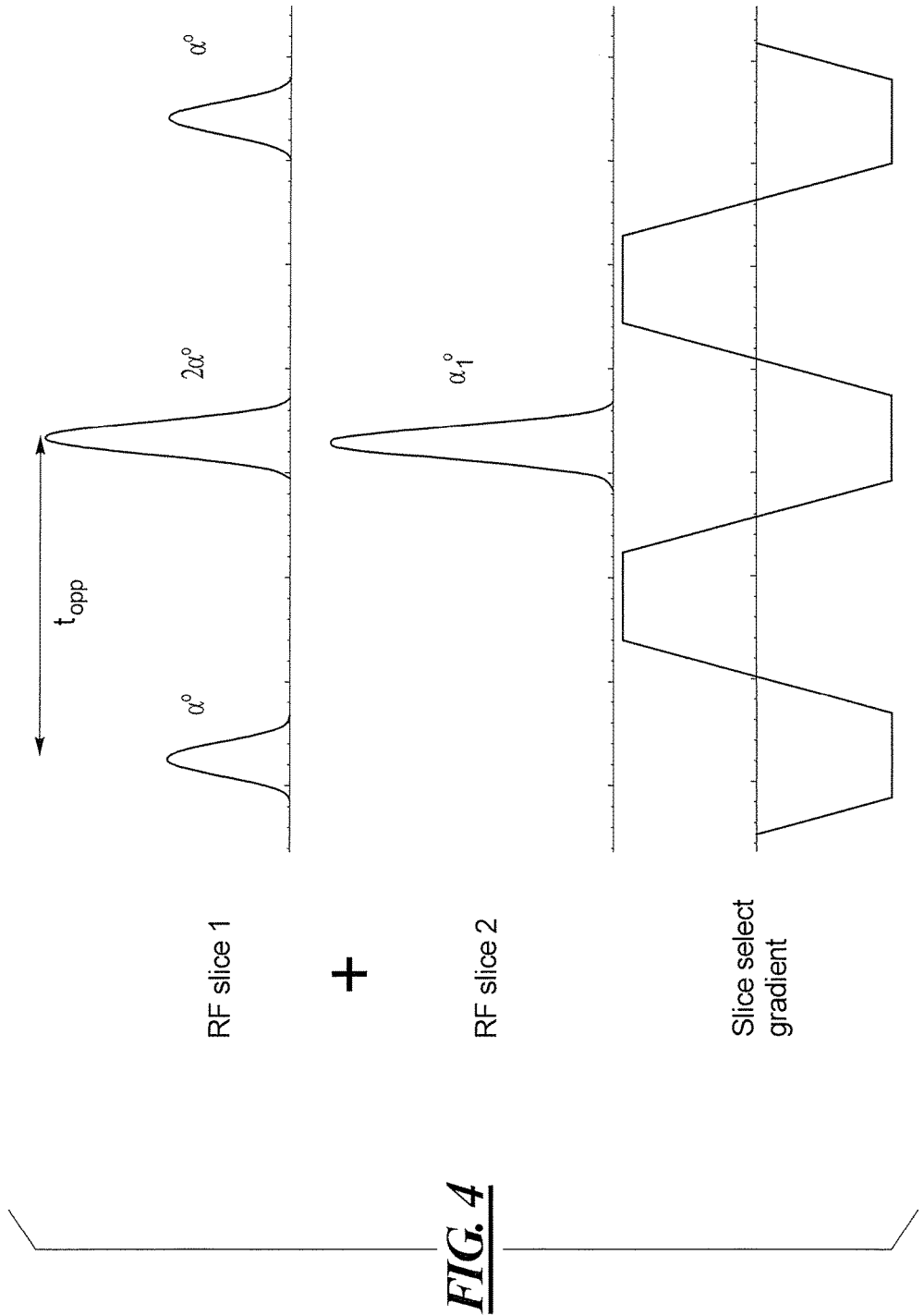
FIG. 4 shows a multi-band binomial pulse in accordance with the invention, and a slice select gradient, in a second embodiment of the method according to the invention.
Figure 6:
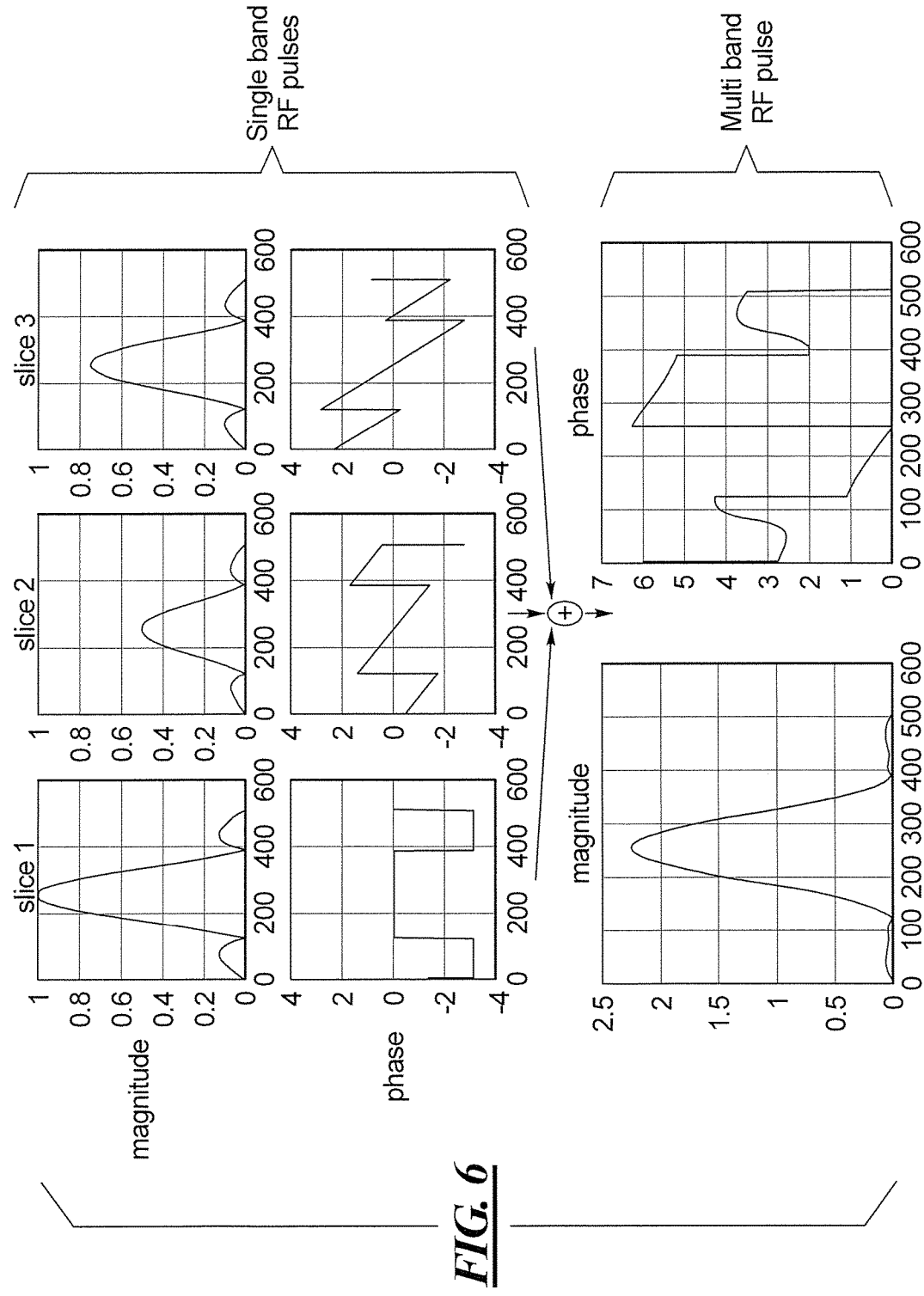
FIG. 6 reproduces FIG. 4 from co-pending application Ser. No. 15/093,164 and schematically illustrates how flip angles can be independently set for the simultaneously excited slices.

A schematic illustration of the generation of such a multi-band pulse that targets multiple slices simultaneously is shown in FIG. 6 herein, which is a copy of FIG. 4 from co-pending application Ser. No. 15/093,164, filed on Apr. 7, 2016, the content of which is incorporated herein by reference.

The different sub-pulses of the binomial RF pulse respectively produce different contrasts in the two slices (i.e., a first contrast in one of the slices and a second, different contrast in the other of the slices). In order to obtain images with both contrasts for both slices, the excitation is then repeated with the respective sub-pulses interchanged for the two slices, so images can then be reconstructed for each slice with each contrast.

Figure 5:
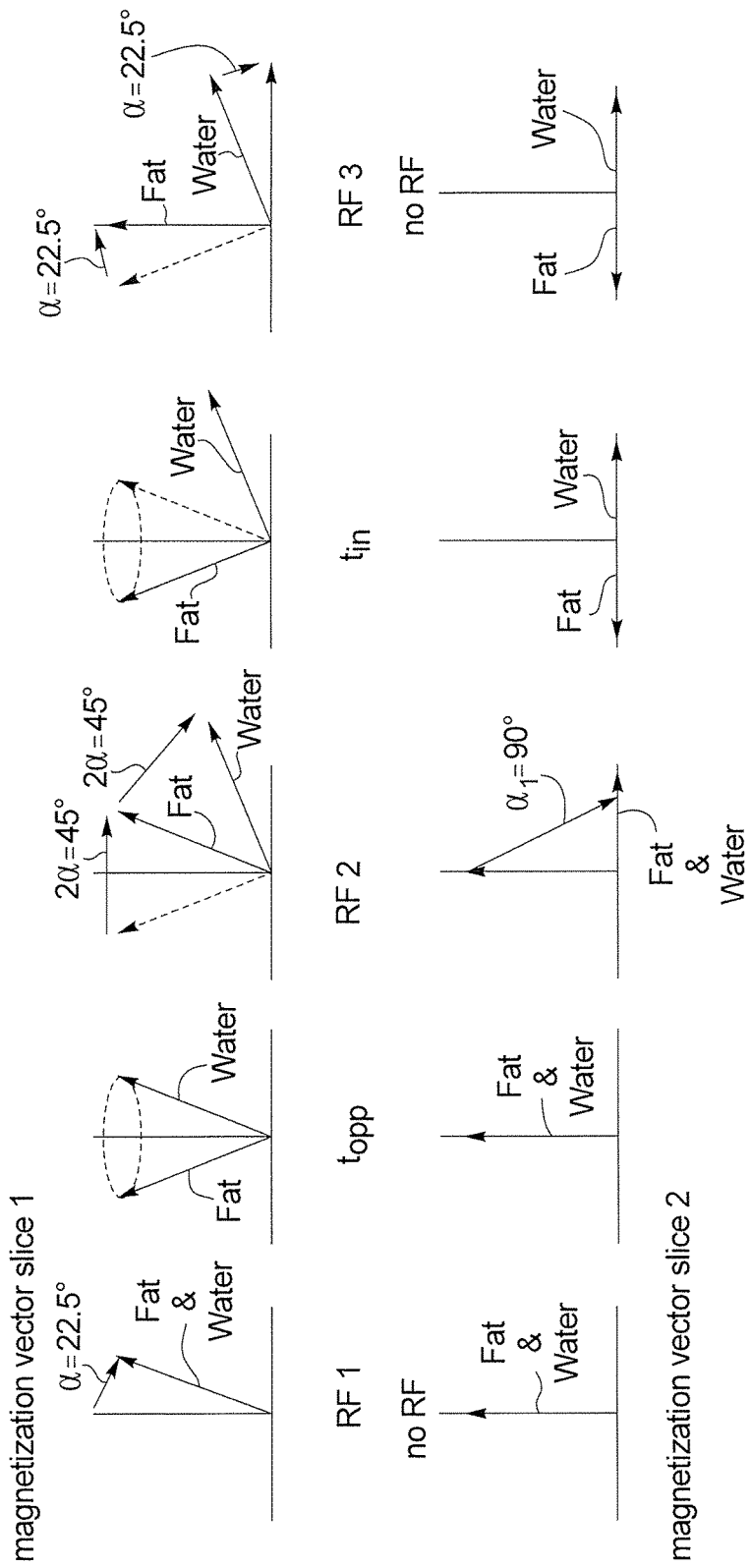
FIG. 5 schematically illustrates the magnetization vectors for fat and water that occur during the execution of the pulse sequence shown in FIG. 4.

A further embodiment of the inventive pulse scheme is shown in FIG. 4, with the evolution of the magnetization vectors for slices 1 and 2 for that embodiment being shown in FIG. 5. FIG. 4 shows the example of a multi-band binomial pulse that excites water only for slice 1, and both fat and water for slice 2. The sub-pulses for both slices are phase-modulated, and summed to form one composite pulse, in the manner shown in FIG. 6. Again, $t_{opp}$ designates the time that fat and water have opposite phase. The angle $\alpha_1$ can be independently set for slice 2 in order to achieve the desired flip angle for slice 2 that, in this embodiment, is identical to the flip angle for slice 1.

As shown in FIG. 5, the initial RF pulse (RF1) tilts fat and water for slice 1 magnetization with both having equal phase after the RF pulse. After the weighting time $t_{opp}$, water and fat vectors are out of phase. A 45° pulse (RF2) is applied to slice 1 and 90° pulse is applied to slice 2. The water and fat spins in slice 2 are tilted by 90°. After another waiting period $t_{opp}(2 \cdot t_{opp} = t_{in})$ the fat magnetization vector is moved back to the z-axis by RF3, while the water vector is completely in the transverse plane for slice 1. For slice 2, there is no change because no RF is applied to slice 2 at this time.

The embodiments shown in FIGS. 2 and 4 are just two of many possibilities. For example, the sub-pulses targeting slice 2 can have different flip angles (such as 67.5° for the first pulse and 22.5° for the third pulse). Also, the second pulse can be included as well if a different pulse phase is used. In general, the phase can be varied for all sub-pulses, which will lead to tipping of the magnetization along different axes. This can also be used to create a weak fat saturation by slightly varying the pulse phases between the individual sub-pulses.

Other binomial schemes having more or fewer sub-pulses than the 1-2-1 scheme shown in FIGS. 2 and 4 can be used. The amount of fat and/or water contribution in the reconstructed image can be varied by varying the flip angles and/or the pulse phases. Also, by changing the inter-pulse spacing $t_{opp}$, other spin species could be targeted as well, such as silicone.

A further option is to apply only the last sub-pulse for the second slice with a flip angle of 90°. This provides the best stability against field variations, and is possible if there is enough leeway for duration and amplitude, for example in 1.5 T systems. Another option is to apply only the middle sub-pulse for the second slice with a flip angle of 90°. This will lead to identical TE for both slices 1 and 2. The flip angle for the individual pulses can be varied to achieve a desired total flip angle for each slice. For example, in the 1-2-1 scheme, for a 90° flip angle, $\alpha = 22.5°$, and for a 40° flip angle, $\alpha = 10°$.

As noted above, the flip angles can be individually set for the simultaneously excited slices, as shown in FIG. 4.

Figure 7:
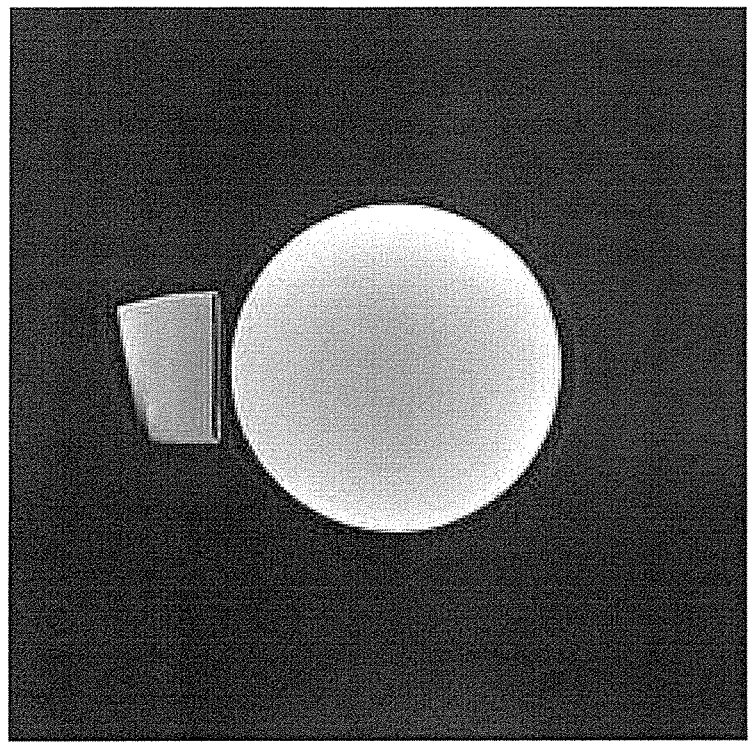
FIG. 7 shows single-band SE acquisitions of the same slice, with image (a) acquired using the water excitation pulse scheme shown in the first row of FIG. 2 and image (b) acquired using the pulse scheme targeting both spin species shown in the second row of FIG. 2
Figure 7:
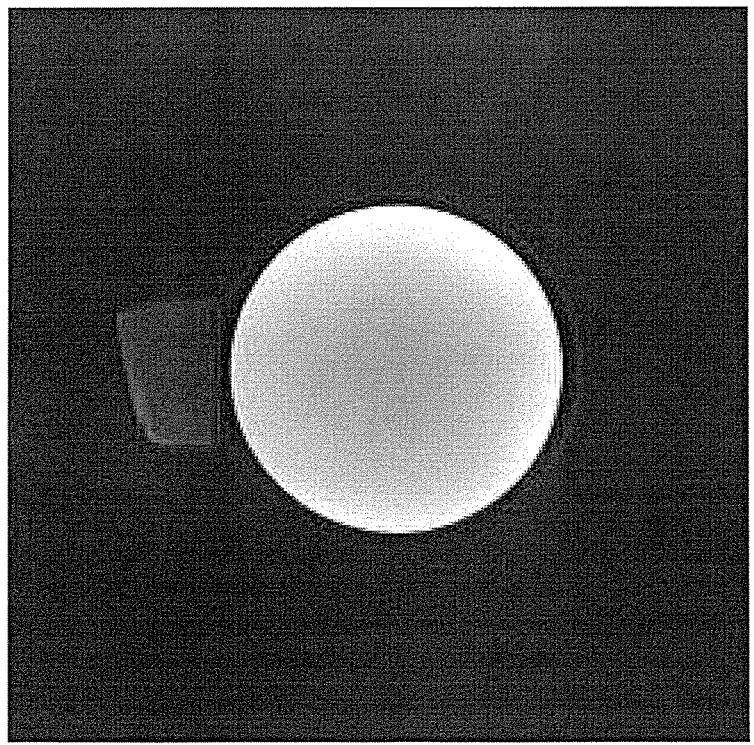

FIG. 7 shows single band SE acquisitions of the same slice in each of images (a) and (b), both of which depict a conventional bottle phantom with a pack of bacon on top of it. Image (a) in FIG. 7 was acquired using the water excitation pulse scheme shown in the first row of FIG. 2. Image (b) in FIG. 7 was acquired using the pulse scheme targeting both spin species, shown in the second row of FIG. 2.

The present invention can be used to particular advantage in TSE imaging of joints, where typically the same contrast is needed both with and without fat saturation.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) raw data with two contrasts in a single scan, said method comprising:
    operating an MR data acquisition scanner, while an examination subject is situated therein in a basic magnetic field having a basic field direction, to execute a simultaneous multi-slice (SMS) data acquisition sequence in which nuclear spins respectively in multiple slices of the examination subject are simultaneously excited by, in a single scan of the examination subject, radiating, from a radio-frequency (RF) radiator of said MR data acquisition scanner, a multi-band (MB) binomial RF pulse in said SMS data acquisition sequence;
    generating said MB binomial RF pulse in said SMS data acquisition sequence by radiating a first subset of pulses that excite different nuclear spin species in a first slice among said multiple slices so as to give the different nuclear spin species respectively different magnetizations in said first slice with respect to said basic field direction that produce a first contrast when an image of said first slice is reconstructed, and a second subset of pulses that excite nuclear spins in a second slice among said multiple slices so as to give the different nuclear spin species respectively different magnetizations in said second slice with respect to said basic field direction that produce a second contrast when an image of said second slice is reconstructed, said first and second contrasts being different from each other;
    in said SMS data acquisition sequence, acquiring raw MR data at least from said first and second slices after said simultaneous excitation of nuclear spins with said MB binomial RF pulse, and entering the acquired raw MR data from said at least first and second slices as k-space data into an electronic memory, organized as k-space; and
    via a computer having access to said electronic memory, making the k-space data in said electronic memory available in electronic form, as a datafile.

2. A method as claimed in claim 1 comprising, in an image reconstruction computer provided with said datafile, reconstructing an image of said first slice with a first contrast and an image of said second slice with a second contrast that differs from said first contrast.

3. A method as claimed in claim 2 wherein said different spin species are water and fat, and wherein said first contrast shows water and fat contributions in said reconstructed image of said first slice and said second contrast shows only water contributions in said reconstructed image of said second slice.

4. A method as claimed in claim 2 comprising separating said k-space data for said multiple slices in k-space for said reconstruction of said images of said first and second slices by executing a parallel reconstruction algorithm in said computer.

5. A method as claimed in claim 4 comprising using the slice Generalized Autocalibrating Partially Parallel Acquisitions (slice GRAPPA) reconstruction algorithm as said parallel acquisition reconstruction algorithm.

6. A method as claimed in claim 1 comprising generating said MB binomial RF pulse in said SMS data acquisition sequence with said first subset of pulses comprising a first pulse, a second and a third pulse in succession, and with said second subset of pulses comprising a first pulse coinciding with said first pulse of said first subset and a last pulse coinciding with said third pulse of said first subset, with no pulse in said second subset between said first and last pulses thereof.

7. A method as claimed in claim 6 wherein said different spin species are water and fat and said MB binomial RF pulse gives water spin species a water magnetization vector and gives said fat spin species a fat magnetization vector, and wherein said first pulse of first subset tilts both fat and water magnetization vectors from said basic field direction with an equal phase, and wherein said second pulse in said first subset is radiated after a waiting time at which the water and fat magnetization vectors are out of phase, with said second pulse in said first subset further tilting the fat and water magnetization vectors, and said third pulse in said first subset moves said fat magnetization vector back to said basic field direction and moves said water magnetization vector to be completely in a plane transverse to said basic field direction, and wherein said first pulse of said second subset maintains both fat and water magnetization vectors in phase and wherein said last pulse of said second subset moves both said fat and water magnetization vectors into said plane that is transverse to said basic magnetic field.

8. A method as claimed in claim 1 wherein said first subset of pulses comprises a first pulse, a second pulse and a third pulse in succession, and wherein said second subset of pulses comprises a pulse coinciding with said second pulse of said first subset and no pulses coinciding with said first and third pulses of said first subset.

9. A method as claimed in claim 8 wherein said different nuclear spin species are water and fat, (a) and said MB binomial RF pulse gives water spin species a water magnetization vector and gives said fat spin species a fat magnetization vector, and wherein said first RF pulse in said first subset tilts both fat and water magnetization vectors with respect to said basic field direction, with said fat and water magnetization vectors thereafter becoming out of phase, and said second pulse in said first subset further tilts said fat and water magnetization vectors with respect to said basic field direction, and the third pulse in said first subset moves the fat magnetization vector back to the basic field direction and places the water magnetization vector in a plane transverse to said basic field direction, and wherein said pulse in said second subset tilts the water and fat magnetization vectors from said basic field direction to said plane that is transverse to said basic field direction.

10. A method as claimed in claim 9 wherein said pulse in said second subset has a different flip angle from a sum of said pulse, said second pulse and said third pulse in said first subset.

11. A method as claimed in claim 1 comprising repeating radiation of said MB binomial RF pulse in said SMS data acquisition sequence with said first and second subsets of pulses interchanged so that said first subset of pulses excites said different nuclear spin species in said second slice and said second subset of pulses excites said different nuclear spin species in said first slice.

12. A method as claimed in claim 11 comprising, in an image reconstruction computer provided with said data file, reconstructing a first image of said first slice with said first contrast and reconstructing a second image of said first slice with said second contrast, and reconstructing a first image of said second slice with said first contrast and reconstructing a second image of said second slice with said second contrast.

13. A magnetic resonance (MR) apparatus comprising:
an MR data acquisition scanner comprising a radio-frequency (RF) radiator, and a basic field magnet that produces a basic magnetic field in a basic field direction;
a computer configured to operate the MR data acquisition scanner, while an examination subject is situated therein in said basic magnetic field, to execute a simultaneous multi-slice (SMS) data acquisition sequence in which nuclear spins respectively in multiple slices of the examination subject are simultaneously excited by, in a single scan of the examination subject, radiating, from a radio-frequency (RF) radiator of said MR data acquisition scanner, a multi-band (MB) binomial RF pulse in said SMS data acquisition sequence;
said computer being configured to operate the MR data acquisition scanner in said SMS data acquisition sequence to generate said MB binomial RF pulse in said SMS data acquisition sequence by radiating a first subset of pulses that excite nuclear spin species in a first slice among said multiple slices so as to give the different nuclear spin species respectively different magnetizations in said first slice with respect to said basic field direction that produce a first contrast when an image of said first slice is reconstructed, and a second subset of pulses that excite said different nuclear spin species in a second slice among said multiple slices so as to give the different nuclear spin species respectively different magnetizations in said second slice with respect to said basic field direction that produce a second contrast when an image of said second slice is reconstructed, said first and second contrasts being different from each other;
said computer being configured to operate the MR data acquisition scanner in said SMS data acquisition sequence in said SMS data acquisition sequence, to acquire raw MR data at least from said first and second slices after said simultaneous excitation of nuclear spins with said MB binomial RF pulse, and to enter the acquired raw MR data from said at least first and second slices as k-space data into said electronic memory, organized as k-space; and
said computer being configured to make the k-space data in said electronic memory available in electronic form, as a datafile.

14. An MR apparatus as claimed in claim 13 comprising an image reconstruction computer provided with said datafile, configured to reconstruct an image of said first slice with said first contrast and an image of said second slice with said second contrast.

15. An MR apparatus as claimed in claim 14 wherein said image reconstruction computer is configured to separate said k-space data for said multiple slices in k-space by executing a parallel reconstruction algorithm in said computer.

16. An MR apparatus as claimed in claim 15 wherein said image reconstruction computer is configured to use the slice Generalized Autocalibrating Partially Parallel Acquisitions (slice GRAPPA) reconstruction algorithm as said parallel acquisition reconstruction algorithm.

17. An MR apparatus as claimed in claim 14 wherein said first contrast shows water and fat contributions in said reconstructed image of said first slice and said second contrast shows only water contributions in said reconstructed image of said second slice.

18. An MR apparatus as claimed in claim 13 wherein said computer is configured to generate said MB binomial RF pulse in said SMS data acquisition sequence with said first subset of pulses comprising a first pulse, a second and a third pulse in succession, and with said second subset of pulses comprising a first pulse coinciding with said first pulse of said first subset and a last pulse coinciding with said third pulse of said first subset, with no pulse in said second subset between said first and last pulses thereof.

19. An MR apparatus as claimed in claim 18 wherein said different spin species are water and fat and said MB binomial RF pulse gives water spin species a water magnetization vector and gives said fat spin species a fat magnetization vector, and wherein said first pulse of first subset tilts both fat and water magnetization vectors from said basic field direction with an equal phase, and wherein said second pulse in said first subset is radiated after a waiting time at which the water and fat magnetization vectors are out of phase, with said second pulse in said first subset further tilting the fat and water magnetization vectors, and said third pulse in said first subset moves said fat magnetization vector back to said basic field direction and moves said water magnetization vector to be in a plane transverse to said basic field direction, and wherein said first pulse of said second subset maintains both fat and water magnetization vectors in phase and wherein said last pulse of said second subset moves both said fat and water magnetization vectors into said plane that is transverse to said basic magnetic field.

20. An MR apparatus as claimed in claim 13 wherein said first subset of pulses comprises a first pulse, a second pulse and a third pulse in succession, and wherein said second subset of pulses comprises a pulse coinciding with said second pulse of said first subset and no pulses coinciding with said first and third pulses of said first subset.

21. An MR apparatus as claimed in claim 20 wherein said different nuclear spin species are water and fat, and said MB binomial RF pulse gives water spin species a water magnetization vector and gives said fat spin species a fat magnetization vector, and wherein said first RF pulse in said first subset tilts both the fat and water magnetization vectors with respect to said basic field direction, with said fat and water magnetization vectors thereafter becoming out of phase, and said second pulse in said first subset further tilts said fat and water magnetization vectors with respect to said basic field direction, and the third pulse in said first subset moves the fat magnetization vector back to the basic field direction and places the water magnetization vector in a plane transverse to said basic field direction, and wherein said pulse in said second subset tilts the water and fat magnetization vectors from said basic field direction to said plane that is transverse to said basic field direction.

22. An MR apparatus as claimed in claim 21 wherein said pulse in said second subset has a different flip angle from said second pulse in said first subset.

23. An MR apparatus as claimed in claim 13 wherein said computer is configured to operate the MR data acquisition scanner to repeat radiation of said MB binomial RF pulse in said SMS data acquisition sequence with said first and second subsets of pulses interchanged so that said first subset of pulses excites said different nuclear spin species in said second slice and said second subset of pulses excites said different nuclear spin species in said first slice.

24. An MR apparatus as claimed in claim 23 comprising an image reconstruction computer provided with said data file, configured to reconstruct a first image of said first slice with said first contrast and to reconstruct a second image of said first slice with said second contrast, and to reconstruct a first image of said second slice with said first contrast and to reconstruct a second image of said second slice with said second contrast.

* * * * *